(12) United States Patent
Sato (10) Patent No.: US 8,740,604 B2
(45) Date of Patent: Jun. 3, 2014

(54) IMPRINT APPARATUS AND ARTICLE MANUFACTURING METHOD

(75) Inventor: Hiroshi Sato, Utsunomiya (JP)

(73) Assignee: Canon Kabushiki Kaisha (JP)

( * ) Notice: Subject to any disclaimer, the term of this patent is extended or adjusted under 35 U.S.C. 154(b) by 16 days.

(21) Appl. No.: 13/008,377

(22) Filed: Jan. 18, 2011

(65) Prior Publication Data

US 2011/0177249 A1   Jul. 21, 2011

(30) Foreign Application Priority Data

Jan. 19, 2010   (JP) ................................. 2010-009529

(51) Int. Cl.
*B05D 3/12* (2006.01)
*B05C 9/12* (2006.01)

(52) U.S. Cl.
USPC ........... 425/385; 264/496; 264/447; 264/134; 425/95; 425/150

(58) Field of Classification Search
USPC ............ 425/385, 95, 135, 150; 264/293, 496, 264/134, 447, 319; 427/8
See application file for complete search history.

(56) References Cited

U.S. PATENT DOCUMENTS

| | | | |
|---|---|---|---|
| 5,772,905 A * | 6/1998 | Chou | 216/44 |
| 6,653,030 B2 * | 11/2003 | Mei et al. | 430/5 |
| 6,972,844 B2 | 12/2005 | Tokita | |
| 7,114,938 B2 * | 10/2006 | Chou | 425/126.1 |
| 7,292,326 B2 * | 11/2007 | Nimmakayala et al. | 356/139.04 |
| 7,414,722 B2 * | 8/2008 | Van Bilsen | 356/401 |
| 7,418,902 B2 * | 9/2008 | Kruijt-Stegeman et al. | 101/485 |
| 7,815,424 B2 * | 10/2010 | Nakamura et al. | 425/150 |
| 8,001,924 B2 | 8/2011 | Dijksman et al. | |
| 8,308,471 B2 * | 11/2012 | Terasaki et al. | 425/385 |
| 2003/0081213 A1 * | 5/2003 | Oishi et al. | 356/401 |
| 2006/0032437 A1 * | 2/2006 | McMackin et al. | 118/100 |
| 2006/0157444 A1 * | 7/2006 | Nakamura et al. | 216/54 |
| 2006/0275524 A1 * | 12/2006 | Santen et al. | 425/385 |
| 2006/0279004 A1 * | 12/2006 | Suehira et al. | 257/797 |
| 2007/0278712 A1 | 12/2007 | Okushima | |
| 2009/0026657 A1 * | 1/2009 | Nimmakayala et al. | 264/293 |
| 2009/0115110 A1 * | 5/2009 | Schumaker | 264/401 |
| 2010/0072653 A1 | 3/2010 | Kawakami et al. | |
| 2011/0076352 A1 * | 3/2011 | Den Boef et al. | 425/385 |
| 2012/0244719 A1 * | 9/2012 | Hatano et al. | 438/759 |

FOREIGN PATENT DOCUMENTS

| | | |
|---|---|---|
| JP | 2003-251792 A | 9/2003 |
| JP | 2005108975 A | 4/2005 |
| JP | 2005167166 A | 6/2005 |
| JP | 2007-273979 A | 10/2007 |
| JP | 2010080632 A | 4/2010 |
| KR | 20070115735 A | 12/2007 |

OTHER PUBLICATIONS

KR OA dated Aug. 23, 2013 for corres. 10-2011-0002712.
Japanese Office Action cited in Japanese counterpart application No. JP2010-009529, dated Sep. 24, 2013.

* cited by examiner

*Primary Examiner* — Joseph S Del Sole
*Assistant Examiner* — Nahida Sultana
(74) *Attorney, Agent, or Firm* — Rossi, Kimms & McDowell LLP (57) ABSTRACT

An imprint apparatus for coating a substrate with a resin by a coating mechanism, and curing the resin while pressing at least one of the substrate and a mold against the other, includes a measurement device configured to detect a position of the coating mechanism, a substrate stage configured to hold a substrate, a positioning system configured to position the substrate stage, and a controller configured to control positioning of the substrate stage by the positioning system, based on the measurement result.

16 Claims, 6 Drawing Sheets

IMPRINT APPARATUS AND ARTICLE MANUFACTURING METHOD

BACKGROUND OF THE INVENTION

1. Field of the Invention

The present invention relates to an imprint apparatus and article manufacturing method.

2. Description of the Related Art

The imprint technique is a technique capable of transferring nanoscale micropatterns, and is beginning to be put into practical use as one lithographic technique of mass-producing magnetic storage media and next-generation semiconductor devices. In the imprinting, a mold having a micropattern is used as an original to form the micropattern on a substrate such as a silicon wafer or glass plate. This micropattern is formed by coating a substrate with an imprint resin, and curing the resin while a mold pattern is pressed against the resin on the substrate. Japanese Patent Laid-Open No. 2005-108975 discloses a micropatterning apparatus in which an alignment scope for measuring the relative displacement between an original and substrate is arranged on a wafer stage.

An imprint apparatus includes a coating mechanism for coating a substrate with a resin. The coating mechanism must accurately be aligned with a shot region on a substrate in order to accurately coat the shot region with a resin. Conventionally, however, if the coating mechanism is displaced from the designed position of the imprint apparatus, the coating mechanism cannot accurately be aligned with a shot region, so the shot region cannot accurately be coated with a resin.

SUMMARY OF THE INVENTION

The present invention provides a technique advantageous in accurately coating a shot region with a resin.

One of the aspects of the present invention provides an imprint apparatus for coating a substrate with a resin by a coating mechanism, and curing the resin while pressing at least one of the substrate and a mold against the other, the apparatus comprising a measurement device configured to detect a position of the coating mechanism, a substrate stage configured to hold a substrate, a positioning system configured to position the substrate stage, and a controller configured to control positioning of the substrate stage by the positioning system, based on a result of measurement by the measurement device.

Further features of the present invention will become apparent from the following description of exemplary embodiments with reference to the attached drawings.

DESCRIPTION OF THE EMBODIMENTS

Embodiments of the present invention will be explained below with reference to the accompanying drawings.

First Embodiment

Figure 1:
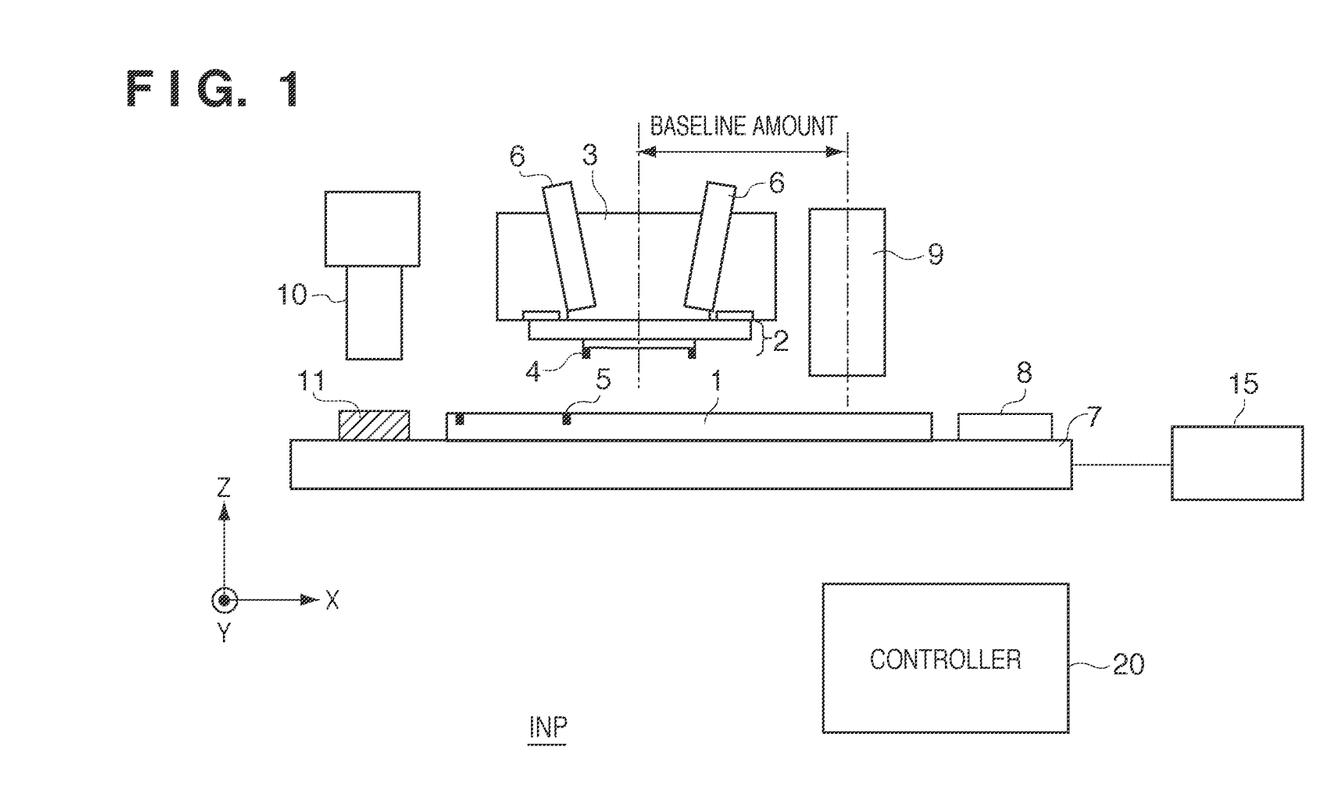
FIG. 1 is a view showing an outline of the arrangement of an imprint apparatus according to the first embodiment of the present invention.

An imprint apparatus INP of the first embodiment of the present invention will be explained below with reference to FIG. 1. The explanation will be made based on the XYZ coordinate system in which a plane parallel to the surface of a wafer (substrate) 1 (or a surface on which the wafer 1 is to be arranged) is the X-Y plane, and a direction perpendicular to the X-Y plane is the Z-axis direction.

The imprint apparatus INP of this embodiment is designed such that a coating mechanism 10 coats a wafer (substrate) with a resin, and a pattern of the resin is formed by curing the resin while at least one of the wafer and a mold 2 is pressed against the other. The imprint apparatus INP includes a head 3 that holds a mold 2 for molding the resin with which the wafer 1 is coated. Scopes 6 are arranged on the head 3. The scopes 6 optically measure the positions of marks 4 formed on the mold 2 and the positions of marks 5 formed on the wafer 1, thereby measuring the positional relationship between the marks 4 and 5. The scopes 6 can be designed to measure the positional relationship between the marks 4 and 5 by capturing the marks 4 and 5, and processing the captured images. The scopes 6 may be designed to measure the positional relationship between the marks 4 and 5 by detecting an interference fringe or moire formed by the marks 4 and 5.

The imprint apparatus INP further includes a wafer stage (substrate stage) 7 for holding the wafer 1, and a positioning system 15 for positioning the wafer stage 7. In addition, the imprint apparatus INP includes an off-axis alignment scope (to be referred to as an OA scope hereinafter) 9, the coating mechanism 10, and a controller 20. A reference mark 8 is mounted on the wafer stage 7. The OA scope 9 is arranged in a position offset from the pattern center of the mold 2 held by the head 3. The closer the position of the OA scope 9 to the mold 2, the smaller the baseline amount, and the smaller an error caused by, for example, the θ component of the wafer 1. The coating mechanism 10 includes discharge outlets 12 for discharging a resin to coat, with the resin, a shot region on the wafer 1 against which the mold 2 is to be pressed.

A measurement device 11 is mounted on the wafer stage 7. A stage driving mechanism (for example, a linear motor) (not shown) drives the wafer stage 7 at high speed. To facilitate acceleration and deceleration of the wafer stage 7 and reduce the electric power, the measurement device 11 may be designed to be detachable from the wafer stage 7 and attached to the wafer stage 7 as needed. The measurement device 11 can have a function of measuring the position of a detection target portion in a direction parallel to the surface of the wafer 1. For example, the measurement device 11 can be designed to measure the position of the detection target portion by capturing the detection target portion, processing the image, and detecting an interference fringe or moire formed by the detection target portion. When detecting the position of the detection target portion by processing the image, it is possible to, for example, illuminate the detection target portion with light and detect the reflected light from the detection target portion, or illuminate the detection target portion with light and detect light transmitted through the detection target portion. In an arrangement for capturing the detection target portion, for example, the measurement by the measurement device 11 can be performed based on an arbitrary position such as the center of the field of view of capturing. The measurement device 11 can also have a function of measuring the position of a detection target portion in the Z-axis direction, that is, in a direction perpendicular to the surface of the wafer 1. This function can be implemented by, for example, a laser interferometer or oblique incidence type height measurement device.

Figure 2:
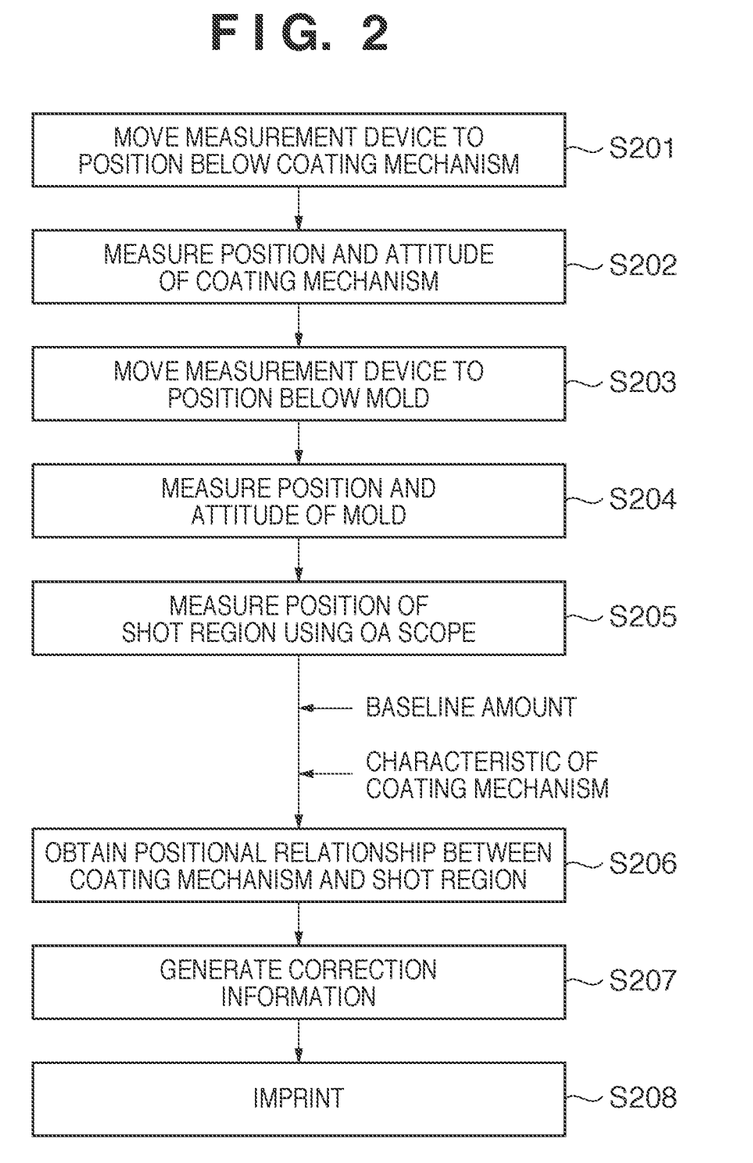
FIG. 2 is a view showing the operation of the imprint apparatus according to the first embodiment of the present invention.

The operation of the imprint apparatus INP will be explained below with reference to FIG. 2. The controller 20 controls this operation. In step S201, the controller 20 controls the positioning system 15 so as to position the measurement device 11 below the coating mechanism 10. The positioning system 15 can include, for example, a position measurement device, compensator, and stage driving mechanism. The position measurement device includes, for example, a laser interferometer, and measures the position of the wafer stage 7. The compensator generates a driving command based on a target position command provided by the controller 20 and position information provided by the position measurement device. The stage driving mechanism includes, for example, a linear motor, and drives the wafer stage 7 based on the driving command.

Figure 3A:
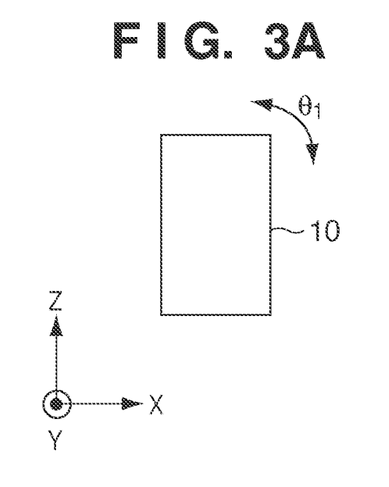
FIGS. 3A to 3C are exemplary views showing a coating mechanism.
Figure 3B:
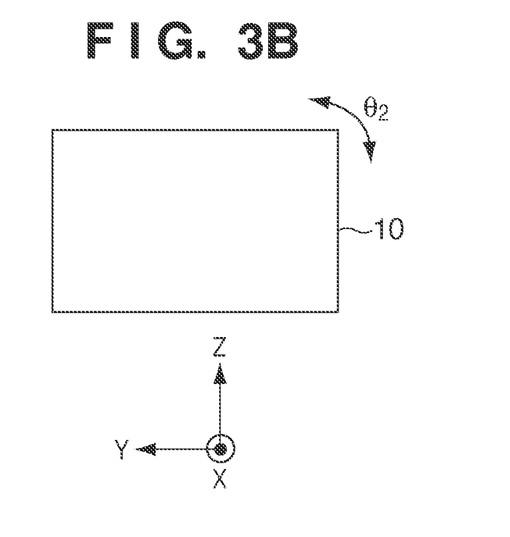
Figure 3C:
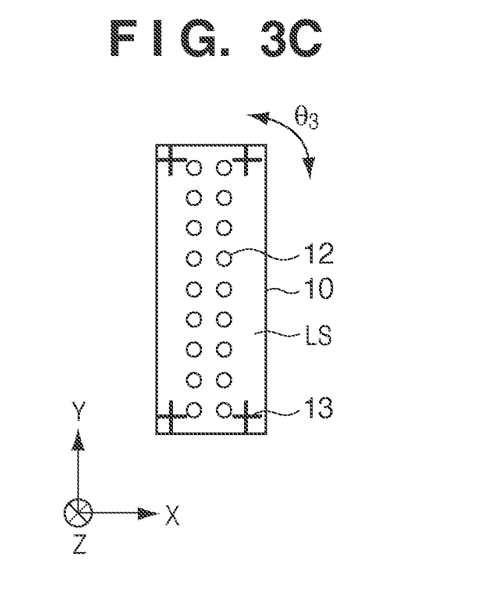

As exemplarily shown in FIG. 3C, the coating mechanism 10 includes a plurality of discharge outlets 12 for discharging a resin, in an opposing surface LS that opposes the wafer 1 when it is coated with the resin. The coating mechanism 10 can also include, on the opposing surface LS, one or a plurality of marks 13 for detecting at least one of the position and tilt of the coating mechanism 10 by using the measurement device 11. The positional relationship between the discharge outlets 12 and marks 13 is already known. In step S202, the controller 20 causes the measurement device 11 to measure one or the plurality of marks 13. When the measurement device 11 measures the position of at least one of marks 13, the controller 20 can detect the position of the coating mechanism 10 based on the measurement result. When the measurement device 11 measures a plurality of marks 13, the controller 20 can detect the attitude of the coating mechanism 10 based on the measurement results. For example, the rotation ($\theta_3$) around the Z-axis can be obtained. It is also possible to measure the positions of the discharge outlets 12 instead of the marks 13. That is, the measurement device 11 can measure the positions of feature portions such as the marks 13 or discharge outlets 12 as measurement target portions. The attitude herein mentioned can include the rotations (tilts) around the X-, Y-, and Z-axes in addition to the X, Y, and Z positions. Various types of measurement devices can be used as the measurement device 11. The measurement device 11 can measure the position of a measurement target portion by, for example, pattern matching between an image of the measurement target portion and a template. The measurement device 11 can also measure the position of a measurement target portion by detecting an interference fringe or moire formed by the measurement target portion. The measurement device 11 can be designed to measure a plurality of measurement target portions in order, and can also be desired to simultaneously measure a plurality of measurement target portions. If a plurality of measurement target portions cannot simultaneously enter the field of view of the measurement device 11, the wafer stage 7 is driven so that a measurement target portion to be measured next enters the field of view.

The measurement device 11 can be designed to measure the height (the position in the Z-axis direction) of a measurement target portion on the opposing surface LS of the coating mechanism 10. The controller 20 can calculate the rotation ($\theta_1$) around the Y-axis as shown in FIG. 3A by measuring the heights of two measurement target portions (for example, the marks 13) having different coordinates in the X-axis direction. To measure the height of the coating mechanism 10, the measurement device 11 can include an interferometer for measuring the position of a measurement target portion in the Z-axis direction. This measurement target portion can be a specific mark or portion. When the opposing surface LS is a flat surface, the measurement target portion can be an arbitrary portion of the opposing surface LS. The controller 20 can calculate the rotation ($\theta_2$) around the X-axis as shown in FIG. 3B by measuring the heights of two measurement target portions (for example, the marks 13) having different coordinates in the Y-axis direction by using the above-described measurement device 11. If the direction in which the resin is discharged from each discharge outlet 12 of the coating mechanism 10 is shifted from the designed direction (in this case, the Z-axis direction), a shift angle $\theta$ can be taken into consideration. Also, if the position of each discharge outlet 12 has a shift amount x from the designed position, the shift amount x can be taken into account. The controller 20 can hold the shift angle $\theta$ and shift amount x as characteristic information indicating the characteristics of the coating mechanism 10.

In step S203, the controller 20 controls the positioning system 15 to move the wafer stage 7 so as to position the measurement device 11 below the mark 4 formed on the mold 2. The moving amount of the wafer stage 7 is a rough relative distance (coarse relative distance) between the coating mechanism 10 and the mold (mark 4).

In step S204, the controller 20 causes the measurement device 11 to measure the position or positions of one or a plurality of marks 4. When the measurement device 11 measures the position of at least one of marks 4, the controller 20 can detect the position of the mold 2 based on the measurement result. When the measurement device 11 measures the positions of a plurality of marks 4, the controller 20 can detect the attitude of the mold 2 based on the measurement results. The attitude can include the rotations (tilts) around the X-, Y-, and Z-axes in addition to the X, Y, and Z positions. If a plurality of marks 4 cannot simultaneously enter the field of view of the measurement device 11, the wafer stage 7 is driven so that the mark 4 to be measured next enters the field of view.

The attitude (P1) of the coating mechanism 10 is detected by the measurement in step S202, the movement of the wafer stage 7 in step S203 gives the coarse relative distance (P2), and the attitude (P3) of the mold 2 is detected by the measurement in step S204. Based on P1, P2, and P3, the controller 20 can determine the positional relationship between the coating mechanism 10 and mold 2. For example, when P1 and P3 are position information, P1+P2+P3=P4 gives the positional relationship between the coating mechanism 10 and mold 2. When P1 and P3 include the rotations (tilts) around the X-, Y-, and Z-axes, the relative rotation between the coating mechanism 10 and mold 2 can be corrected by rotating the wafer stage 7 or wafer 1 in accordance with the tilts. It is also possible to rotate the coating mechanism 10 by giving it a rotating function. In this case, the coating mechanism 10 can be designed to rotate around at least one of the X-, Y-, and Z-axes. This makes it possible to control the relative attitude between the coating mechanism 10 and mold 2. The attitude control of the wafer 1 and that of the coating mechanism 10 can also be combined.

Steps S201 to S204 can be executed when the coating mechanism 10 is replaced, before the start of the processing of the first wafer of a lot including a plurality of wafers, or whenever the processing of a given number of wafers is complete.

Step S205 is executed for each wafer 1. In step S205, the position and rotation of each shot region on the wafer 1 are measured by the global alignment method under the control of the controller 20. More specifically, the positions of a plurality of marks 5 on the wafer 1 are measured using the OA scope 9, and the position and rotation (P5) of each shot region on the wafer 1 are determined based on the measurement results.

In the imprint apparatus INP, the baseline amount (BL) indicating the positional relationship between the mold 2 and OA scope 9 can be measured for, for example, each predetermined period. The baseline amount can be measured by measuring the positional relationship ($\Delta p1$) between the mark 4 of the mold 2 and the reference mark 8 by using the scope 6, driving the wafer stage 7 (the driving amount is p), and measuring the position ($\Delta p2$) of the reference mark 8 by using the OA scope 9. The baseline amount is given by BL=$\Delta p1$+p+$\Delta p2$. The controller 20 determines the positional relationship (P6) between the mold 2 and each shot region on the wafer 1 based on P5 and BL. The controller 20 can control the positioning system 15 so as to align the mold 2 and each shot region in an imprint operation based on this positional relationship (P6).

In step S206, the controller 20 determines the positional relationship between the coating mechanism 10 and each shot region based on P4 (the positional relationship between the coating mechanism 10 and mold 2) and P6 (the positional relationship between the mold 2 and each shot region on the wafer 1) described above.

Step S207 can be executed if any of the shift angle $\theta$ and shift amount x of the discharge outlet 12 and $\theta_1$, $\theta_2$, and $\theta_3$ described previously exceeds an allowable range. In step S207, based on, for example, the shift angle $\theta$ and shift amount x of each discharge outlet 12, the controller 20 generates correction information (t to be described later) for correcting the timing at which the resin is discharged from each discharge outlet 12 such that a target position on the wafer is coated with the resin discharged from the discharge outlet 12. In step S207, based on, for example, $\theta_1$ and $\theta_2$, the controller 20 generates correction information for correcting the positional relationship between the coating mechanism 10 and each shot region, so that a target position on the wafer is coated with the resin discharged from each discharge outlet 12. In step S207, based on, for example, $\theta_3$, the controller 20 generates, as correction information, information indicating an amount by which at least one of the wafer stage 7, wafer 1, and coating mechanism 10 is rotated, so that a target position on the wafer is coated with the resin discharged from each discharge outlet 12.

In step S208, the controller 20 controls an imprint operation for a plurality of shot regions on the wafer 1. In this step, the controller 20 controls the coating mechanism 10 and positioning system 15 based on the positional relationship, which is determined in step S206, between the coating mechanism 10 and each shot region, thereby coating the corresponding shot region with the resin. In this step, the attitude of at least one of the wafer stage 7, wafer 1, and coating mechanism 10 can be controlled based on the correction information generated in step 207. Also, the controller 20 causes the positioning system 15 to position the wafer stage 7 based on the positional relationship between the mold 2 and each shot region, and drives the head 3 so as to press the mold 2 against the corresponding shot region.

Figure 4A:
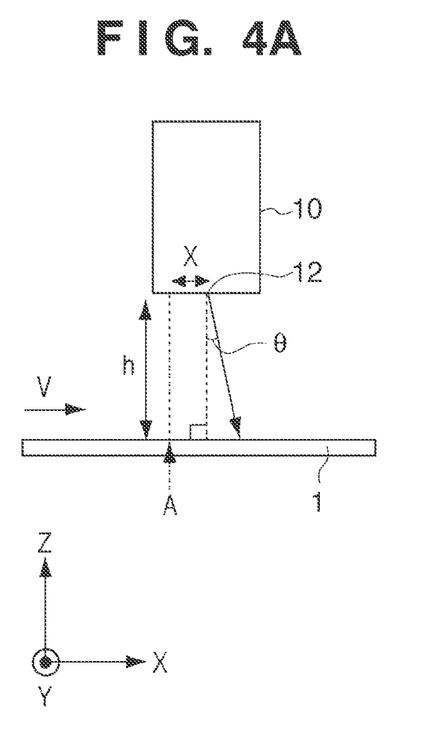
FIGS. 4A and 4B are exemplary views showing a manufacturing error of the coating mechanism.

A method of correcting the shift angle $\theta$ and shift amount x in the resin discharge direction from the discharge outlets 12 by controlling the resin discharge timing will be explained below with reference to FIGS. 4A and 4B. An example in which the wafer 1 is coated with the resin while the wafer 1 is scanned will be explained. Assume that a target position to be coated with the resin is A in FIG. 4A. Each discharge outlet 12 discharges the resin at an angle $\theta$. Letting h be the distance from the discharge outlet 12 to the wafer 1, x be the shift amount of the discharge outlet 12, and V be the rate at which the positioning system 15 scans the wafer stage 7, equation (1) below holds.

$$t=h\times\tan(\theta)/V+x/V \quad (1)$$

Figure 4B:
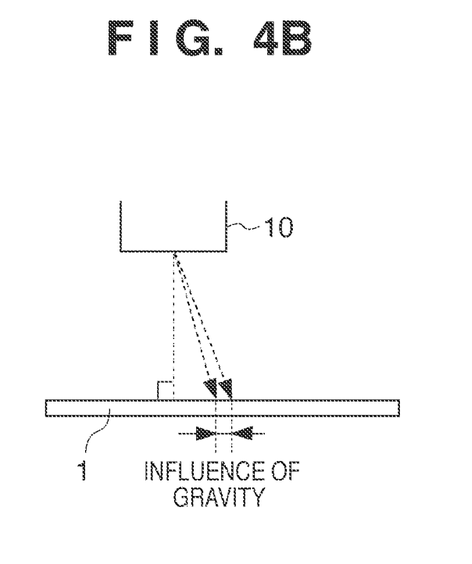

The target position A on the wafer 1 can be coated with the resin by changing the resin discharge timing of each discharge outlet 12 by the time t given by equation (1). Note that the distance between the discharge outlet 12 and wafer 1 is very short and is not added to the above-mentioned relationship. As shown in FIG. 4B, however, the coating position can be corrected with a higher accuracy by correcting t by taking account of the influence of the gravity.

In the above example, the position of each shot region is detected by the global alignment method by measuring the mark position by using the OA scope 9. However, the present invention is not limited to this. For example, when the relationship between the outer shape of the wafer 1 and the position of each shot region is already known, the position of each shot region can be determined by measuring the outer shape of the wafer 1.

In the above-mentioned processing, when the positional relationship between the mark 4 of the mold 2 and the mark 5 on the wafer 1 is measured by using the scope 6, the measurement by the OA scope 9 and the measurement of the baseline amount are no longer necessary. In this case, the positional relationship (P6) between the mold 2 and each shot region need only be determined based on the positional relationship, which is measured using the scope 6, between the mark 4 of the mold 2 and the mark 5 on the wafer 1. Based on the positional relationship P6 and the above-described positional relationship P4, the positional relationship between the coating mechanism 10 and each shot region can be determined.

Second Embodiment

The second embodiment provides a modification of the first embodiment. When a measurement device 11 and reference mark 8 are fixed on a wafer stage 7 as shown in FIG. 1, their relative positions are already known. Therefore, the positional relationship (P7) between the reference mark 8 and a coating mechanism 10 can be obtained by measuring the attitude of the coating mechanism 10 by using the measurement device 11. It is also possible to detect the attitude (P1 described earlier) of the coating mechanism 10 by using the measurement device 11. Furthermore, the position and rotation (P5 described earlier) of each shot region on a wafer can be obtained by the global alignment method. Also, the baseline amount (BL) can be obtained by the above-described method. Based on P1, P5, BL, and P7, a controller 20 determines the positional relationship between the coating mechanism 10 and each shot region (this process is equivalent to step S206 described previously). In addition, the controller 20 may execute step S207 described previously.

In the above-mentioned processing, when the positional relationship between a mark 4 of a mold 2 and a mark 5 on a wafer 1 is measured by using a scope 6, the measurement by an OA scope 9 and the measurement of the baseline amount are no longer necessary. In this case, the positional relationship (P6) between the mold 2 and each shot region need only be determined based on the positional relationship, which is measured using the scope 6, between the mark 4 of the mold 2 and the mark 5 on the wafer 1. Based on the positional relationship P6, P1, and P7, the positional relationship between the coating mechanism 10 and each shot region can be determined. In the second embodiment, as similar to the first embodiment, the attitude of at least one of the wafer stage 7, wafer 1, and coating mechanism 10 can be controlled based on the correction information. Also, the resin discharge timing can be changed or controlled based on the correction information.

Third Embodiment

Figure 5:
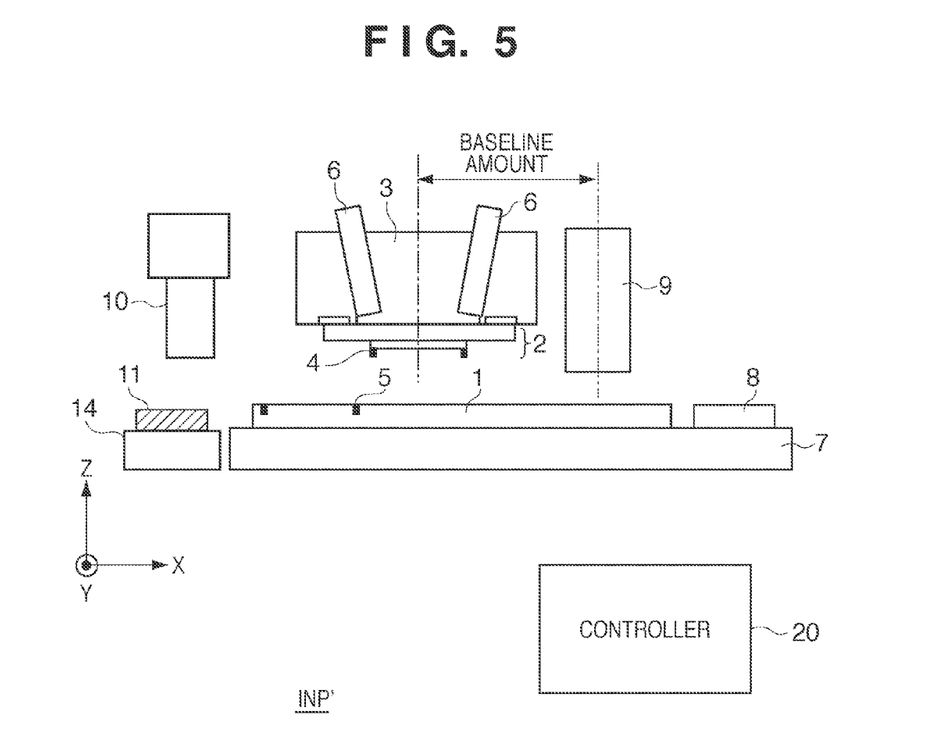
FIG. 5 is a view showing an outline of the arrangement of an imprint apparatus according to the third embodiment of the present invention.
Figure 6:
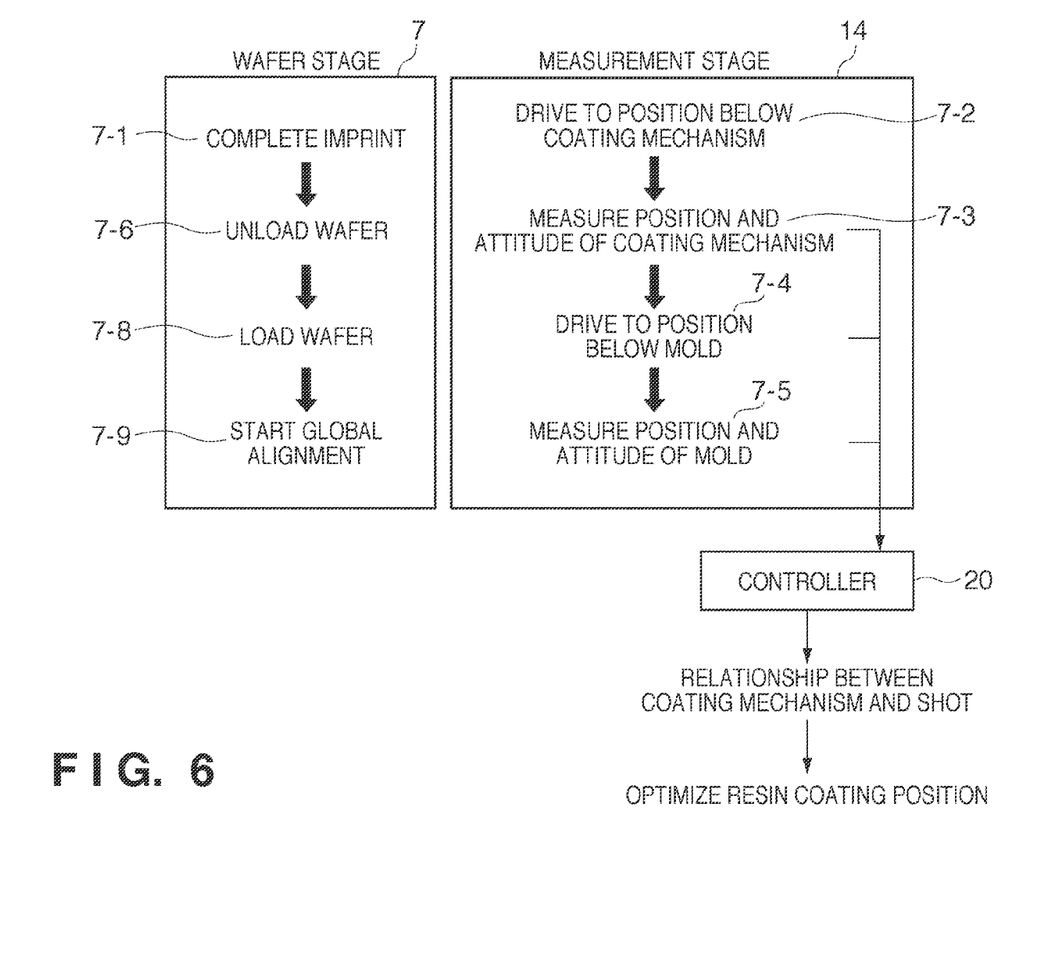
FIG. 6 is a view showing the operation of the imprint apparatus according to the third embodiment of the present invention.

An imprint apparatus INP of the third embodiment of the present invention will be explained below with reference to FIGS. 5 and 6. In the third embodiment, a measurement device 11 is arranged on a measurement stage 14. The measurement stage 14 is a constituent element separated from a wafer stage 7. The wafer stage 7 and measurement stage 14 are driven without any interference between them.

When imprint steps (resin coating, mold pressing, and resin curing) for all shot regions on a wafer 1 mounted on the wafer stage 7 are complete, the wafer stage 7 is driven to an unloading position so as to enable unloading of the wafer (7-1).

When the wafer stage 7 moves away from a position below a coating mechanism 10 and head 3, a driving mechanism (not shown) drives the measurement stage 14 so as to position the measurement device 11 below the coating mechanism 10 (7-2). In the same manner as in the first or second embodiment, the position (and attitude) of the coating mechanism 10 is measured by using the measurement device 11 moved to the position below the coating mechanism 10 (7-3). Note that when a reference mark 8 is formed on the measurement stage 14, all measurements are complete by only the measurement of the position (and attitude) of the coating mechanism 10 described above, as in the second embodiment. If no reference mark 8 is formed on the measurement stage 14, the measurement stage 14 is driven to position the measurement device 11 below a mold 2, as in the first embodiment (7-4). Then, the position (and attitude) of the mold 2 is measured by using the measurement device 11 (7-5).

While the processing for the measurement on the side of the measurement stage 14 is executed, the wafer is unloaded from the wafer stage 7 (7-6), and the next wafer is loaded onto the wafer stage 7 (7-8). When the processing on the side of the measurement stage 14 is complete and the measurement stage 14 is retracted, global alignment is started (7-9).

After that, the positional relationship between the coating mechanism 10 and each shot region is determined (step S206), correction information is generated as needed (step S207), and imprinting is executed (step S208), as in the first or second embodiment. In the third embodiment, as similar to the first embodiment, the attitude of at least one of the wafer stage 7, wafer 1, and coating mechanism 10 can be controlled based on the correction information. Also, the resin discharge timing can be changed or controlled based on the correction information.

The third embodiment can increase the productivity because unloading and loading of wafers are executed in parallel with the measurement by the measurement device 11.

Fourth Embodiment

An imprint apparatus INP of the fourth embodiment of the present invention will be explained below with reference to FIGS. 1 and 3A to 3C. In the first to third embodiments, the position and rotation of a coating mechanism 10 are measured by using scopes arranged on a stage. Although this method can perform accurate measurements, the method is not suited to performing measurements for each short period or in real time, because the measurements are time-consuming. Therefore, a method capable of simply performing measurements within a short time will be described below.

The relative positions and rotation amounts of a mold 2 and wafer 1 can be measured by using scopes 6. Based on the measurement results, a stage 7 makes the rotating direction of the wafer 1 equal to that of the mold 2. In addition, the position and attitude of the coating mechanism 10 can be measured by a measurement device such as an interferometer. For example, $\theta_1$, $\theta_2$, and $\theta_3$ shown in FIG. 3C can be measured for each short period or in real time by measuring each side surface of the coating mechanism 10 by an interferometer or the like.

The scopes 6 and the measurement device (not shown) for measuring the position and attitude of the coating mechanism 10 have a sufficient positional accuracy with respect to the reference of the imprint apparatus, the relative positions and rotations of three components, that is, the mold 2, wafer 1, and coating mechanism 10 can simply be measured by the scopes 6 and measurement device. If change with time is an important factor, it is only necessary to periodically perform calibration by the method of the first, second, or third embodiment. Note that the measured positions of the three components are corrected by the same method as in the first embodiment.

In the imprint apparatus of the fourth embodiment, even if the displacement of the mold or coating mechanism occurs when transferring patterns onto a plurality of shots on a wafer, the coating mechanism or wafer stage can be controlled within a short time period. Accordingly, the productivity can be increased.

[Others]

In the first to fourth embodiments, the order of measurements can be changed. For example, any of the coating mechanism 10, mold 2, and mark 4 can be measured first.

[Article Manufacturing Method]

A method of manufacturing an article by processing a substrate on which patterns are formed by using the above-described imprint apparatus will be described below. A method of manufacturing a device (for example, a semiconductor integrated circuit device or liquid crystal display device) as an article includes a step of transferring (forming) patterns onto a substrate (for example, a wafer, glass plate, or film-like substrate) by using the above-described imprint apparatus. This manufacturing method can further include a step of etching the substrate having the transferred patterns. Note that when manufacturing another article such as a patterned medium (recording medium) or optical device, the manufacturing method can include another processing step of processing the substrate having the transferred patterns, instead of the etching step.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2010-009529, filed Jan. 19, 2010, which is hereby incorporated by reference herein in its entirety.

What is claimed is:

1. An imprint apparatus for coating a substrate with a resin by a coating mechanism that includes a discharge outlet, and curing the resin, the apparatus comprising:
   a measurement device configured to detect a position of a mark on the coating mechanism;
   a substrate stage configured to hold a substrate;
   a positioning system configured to position the substrate stage; and
   a controller configured to control positioning of the substrate stage by the positioning system, based on the position of the mark detected by the measurement device.

2. The apparatus according to claim 1, wherein:
   the substrate is coated with the resin by the coating mechanism while scanning the substrate stage by the positioning system, and
   the controller controls a timing at which the coating mechanism coats the substrate with the resin so that a target position of the substrate is coated with the resin, based on the position of the mark detected by the measurement device.

3. The apparatus according to claim 1, wherein the measurement device is arranged on the substrate stage.

4. The apparatus according to claim 1, wherein the measurement device is arranged on a measurement stage different from the substrate stage.

5. The apparatus according to claim 1, wherein:
   the discharge outlet is disposed in an opposing surface which opposes the substrate when the substrate is coated with the resin,
   the measurement device has a function of measuring positions of a plurality of marks on the opposing surface in a direction perpendicular to a surface of the substrate held on the substrate stage, and
   the controller calculates a tilt of the coating mechanism based on the positions of the plurality of marks on the opposing surface, which are measured by the measurement device, and controls the positioning of the substrate stage by the positioning system, based on the tilt, so that a target position of the substrate is coated with the resin.

6. The apparatus according to claim 2, wherein:
   the discharge outlet is disposed in an opposing surface which opposes the substrate when the substrate is coated with the resin,
   the measurement device has a function of measuring positions of a plurality of marks on the opposing surface in a direction perpendicular to a surface of the substrate held on the substrate stage, and
   the controller calculates a tilt of the coating mechanism based on the positions of the plurality of marks on the opposing surface, which are measured by the measurement device, and controls the timing at which the coating mechanism coats the substrate with the resin, based on the tilt, so that a target position of the substrate is coated with the resin.

7. An imprint apparatus for coating a substrate with a resin by a coating mechanism that includes a discharge outlet while scanning the substrate, and curing the resin, the apparatus comprising:
   a measurement device configured to detect a position of a mark on the coating mechanism; and
   a controller configured to control a timing at which the coating mechanism coats the substrate with the resin so that a target position of the substrate is coated with the resin, based on the position of the mark detected by the measurement device.

8. An imprint apparatus for coating a substrate with a resin by a coating mechanism that includes a discharge outlet, and curing the resin, the apparatus comprising:
   a measurement device configured to detect positions of marks on the coating mechanism; and
   a controller configured to control an attitude of the coating mechanism based on the positions of the marks detected by the measurement device.

9. The apparatus according to claim 8, wherein:
   the discharge outlet is disposed in an opposing surface which opposes the substrate when the substrate is coated with the resin,
   the measurement device has a function of measuring positions of the marks on the opposing surface in a direction perpendicular to a surface of the substrate held on the substrate stage, and
   the controller calculates a tilt of the coating mechanism based on the positions of the marks on the opposing surface, which are measured by the measurement device, and controls the attitude of the coating mechanism, based on the tilt, so that a target position of the substrate is coated with the resin.

10. An imprint apparatus for coating a substrate with a resin by a coating mechanism that includes a discharge outlet, and curing the resin, the apparatus comprising:
    a measurement device configured to detect a position of the discharge outlet;
    a substrate stage configured to hold a substrate;
    a positioning system configured to position the substrate stage; and
    a controller configured to control positioning of the substrate stage by the positioning system, based on the position of the discharge outlet detected by the measurement device.

11. An imprint apparatus for coating a substrate with a resin by a coating mechanism that includes a discharge outlet, and curing the resin, the apparatus comprising:
    an image capturing device configured to capture an image of a portion of the coating mechanism;
    a substrate stage configured to hold a substrate;
    a positioning system configured to position the substrate stage; and
    a controller configured to control positioning of the substrate stage by the positioning system, based on the image captured by the image capturing device.

12. The apparatus according to claim 10, wherein:
    the coating mechanism includes a plurality of discharge outlets,
    the plurality of discharge outlets are disposed in an opposing surface which opposes the substrate when the substrate is coated with the resin,
    the measurement device has a function of measuring positions of the plurality of discharge outlets on the opposing surface in a direction perpendicular to a surface of the substrate held on the substrate stage, and
    the controller calculates a tilt of the coating mechanism based on the positions of the plurality of discharge outlets on the opposing surface, which are measured by the measurement device, and controls the positioning of the substrate stage by the positioning system, based on the tilt, so that a target position of the substrate is coated with the resin.

13. An imprint apparatus for coating a substrate with a resin by a coating mechanism that includes a discharge outlet while scanning the substrate, and curing the resin, the apparatus comprising:
- a measurement device configured to detect a position of the discharge outlet; and
- a controller configured to control a timing at which the coating mechanism coats the substrate with the resin so that a target position of the substrate is coated with the resin, based on the position of the discharge outlet detected by the measurement device.

14. An imprint apparatus for coating a substrate with a resin by a coating mechanism that includes discharge outlets, and curing the resin, the apparatus comprising:
- a measurement device configured to detect positions of the discharge outlets; and
- a controller configured to control an attitude of the coating mechanism based on the positions of the discharge outlets detected by the measurement device.

15. An imprint apparatus for coating a substrate with a resin by a coating mechanism that includes a discharge outlet, and curing the resin, the apparatus comprising:
- an image capturing device configured to capture an image of a portion of the coating mechanism; and
- a controller configured to control a timing at which the coating mechanism coats the substrate with the resin so that a target position of the substrate is coated with the resin, based on the image captured by the image capturing device.

16. An imprint apparatus for coating a substrate with a resin by a coating mechanism that includes a discharge outlet, and curing the resin, the apparatus comprising:
- an image capturing device configured to capture an image of a portion of the coating mechanism; and
- a controller configured to control an attitude of the coating mechanism based on the image captured by the image capturing device.

* * * * *